(12) United States Patent
Irie

(10) Patent No.: US 7,919,981 B2
(45) Date of Patent: Apr. 5, 2011

(54) INTEGRATED CIRCUIT DESIGN BASED ON SCAN DESIGN TECHNOLOGY

(75) Inventor: Kazuyuki Irie, Kanagawa (JP)

(73) Assignee: RENESAS Electronics Corporation, Kawasaki-shi, Kanagawa (JP)

(*) Notice: Subject to any disclaimer, the term of this patent is extended or adjusted under 35 U.S.C. 154(b) by 424 days.

(21) Appl. No.: 12/219,742

(22) Filed: Jul. 28, 2008

(65) Prior Publication Data
US 2009/0032899 A1    Feb. 5, 2009

(30) Foreign Application Priority Data
Jul. 31, 2007 (JP) .................. 2007-198617

(51) Int. Cl.
*H03K 19/173* (2006.01)
(52) U.S. Cl. .................. 326/46; 326/93; 326/8; 714/726
(58) Field of Classification Search .............. 326/21, 326/38, 46, 93–98, 8; 714/724–731
See application file for complete search history.

(56) References Cited

U.S. PATENT DOCUMENTS

| 7,383,523 | B2 | 6/2008 | Inoue |
| 2006/0066357 | A1 | 3/2006 | Inoue |
| 2006/0075315 | A1* | 4/2006 | Cruz et al. ............ 714/726 |
| 2008/0092002 | A1* | 4/2008 | Shimooka ............ 714/731 |

FOREIGN PATENT DOCUMENTS

| JP | 2005-322694 | 11/2005 |
| JP | 2006-128635 | 5/2006 |

* cited by examiner

*Primary Examiner* — Don P Le
(74) *Attorney, Agent, or Firm* — McGinn IP Law Group, PLLC

(57) ABSTRACT

An integrated circuit is provided with a scan chain including a scan flip-flop and a dummy block. The dummy block has a clock terminal receiving a clock signal, a scan input terminal connected to a scan data line within the scan chain, and a scan output terminal connected to another scan data line within the scan chain. The dummy block is configured to output data on the scan output terminal in response to input data fed to the scan input terminal, not responsively to the clock signal.

15 Claims, 11 Drawing Sheets

INTEGRATED CIRCUIT DESIGN BASED ON SCAN DESIGN TECHNOLOGY

INCORPORATION BY REFERENCE

This application claims the benefit of priority based on Japanese Patent Application No. 2007-198617, filed on Jul. 31, 2007, the disclosure of which is incorporated herein by reference.

BACKGROUND OF THE INVENTION

1. Field of the Invention

The present invention relates to a semiconductor integrated circuit and a method of designing the same. More particularly, the present invention relates to a design-for-testability technology based on scan design.

2. Description of the Related Art

Semiconductor integrated circuits are tested after the manufacture to detect malfunctions of the circuits, such as delay faults and stuck-at faults. One known integrated circuit design technique for improving testability is to incorporate test circuits into the circuits to be designed. Such design technique is often referred to as design for testability (DFT).

The scan design is one of the known design-for-testability techniques. In a semiconductor integrated circuit based on the scan design, all or some of the flip-flops within the circuit to be designed are replaced with scan flip-flops. In the test, the scan flip-flops are operated to form a scan chain (or a scan path) and the scan test is carried out by entering a test pattern and reading the states of the flip-flops through the scan path.

In the development of a semiconductor integrated circuit, the change of the function of the circuit may be required. One approach for completing the design change in a short time is to integrate dummy cells for allowing design change within the circuit to be designed in advance, as disclosed by Kumano et al. in Japanese Laid Open Patent Application No. JP-P2005-322694A. The dummy cells are spare cells which are originally unnecessary for the circuit to be designed, but used in case of design change if necessary.

In Japanese Laid Open Patent Application No. JP-P2006-128635A, Inoue discloses a technique in which spare scan flip-flop cells are preliminarily prepared in addition to scan flip-flop cells for allowing design change. The spare scan flip-flop cells are designed to have the same function as the normal scan flip-flop cells, and incorporated into the circuit to be designed when a design change is required. One issue is that the clock supply may be unbalanced when a clock line is newly connected to a spare scan flip-flop cell in the design change. In order to address this, the Inoue's technique performs clock tree synthesis for both of the normal scan flip-flop cells and the spare scan flip-flop cells. In the layout design, a clock tree circuit is connected to both of the normal scan flip-flop cells and the spare scan flip-flop cells. This allows supplying a timing-adjusted clock signal to both of the normal scan flip-flop cells and the spare scan flip-flop cells through the clock tree circuit.

According to the inventor's study, however, the Inoue's approach suffers from useless increase in the power consumption. In an integrated circuit designed in accordance with the Inoue's technique, a clock signal is fed not only to normal scan flip-flops but also to spare scan flip-flops. Therefore, the spare scan flip-flops are also operated in response to the clock signal in circuit operations. This leads to useless power consumption.

One possible approach for power consumption reduction is to additionally incorporate a clock gating circuit through which a clock signal is fed to the spare scan flip-flops. The clock gating circuit allows stopping the clock supply to the spare scan flip-flops in response to a control signal to thereby suppress the useless power consumption in circuit operations. However, the additionally-provided clock gating circuit requires the chip resource and increases the chip size.

SUMMARY

In an aspect of the present invention, an integrated circuit design technique based on scan flip-flop cells and dummy block cells is presented. The scan flip-flop cells are cells incorporating scan flip-flops. The dummy block cells are spare cells to be replaced with scan flop-flop cells when design change is required. The dummy block cells each include a clock terminal for receiving a clock signal, a scan input terminal to be connected with a scan data line within a scan chain, and a scan output terminal to be connected with another scan data line within the scan chain. The dummy block cells are designed to output data on the scan output terminal in response to input data fed to the scan input terminal, not responsively to the clock signal.

One preferred design procedure is as follows: First, cells including scan flip-flop cells and dummy block cells are placed at desired positions within a circuit to be designed. This is followed by clock tree synthesis for the scan flip-flop cells and the dummy block cells. Subsequently, interconnection routing among the placed cells is performed so as to form a scan path with the scan flip-flop cells and the dummy block cells. When design change is requested, one or more dummy cells are replaced with one or more scan flip-flops.

An integrated circuit designed by such design procedure is characterized as follows: The designed integrated circuit is provided with a scan chain including scan flip-flops and a dummy block. The dummy block has a clock terminal receiving a clock signal, a scan input terminal connected to a scan data line within the scan chain, and a scan output terminal connected to another scan data line within the scan chain. The dummy block is configured to output data on the scan output terminal in response to input data fed to the scan input terminal, not responsively to the clock signal.

The dummy block(s) finally left in the final product chip receives the clock signal, but operates not responsively to the clock signal. Therefore, the power consumption of the dummy block is largely reduced, compared with the case where dummy cells of the same configuration as normal scan flip-flop cells are used. The effect of power consumption reduction for the entire chip is enhanced with the increase in the number of integrated dummy blocks. Therefore, the power consumption reduction effect is promoted with the increase in the scale of the integrated circuit accompanied by the advance of the fine processing technology.

The approach of this invention does not require a clock gating circuit through which a clock signal is fed to the dummy blocks. This avoids chip resource waste, making effective use of chip resources. As a result, the chip size is reduced.

BRIEF DESCRIPTION OF THE DRAWINGS

The above and other objects, advantages and features of the present invention will be more apparent from the following description of certain preferred embodiments taken in conjunction with the accompanying drawings, in which.

DESCRIPTION OF PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Circuit Design Procedure

In one embodiment of the present invention, an integrated circuit design procedure based on a design-for-testability technique is provided. In this design procedure, scan flip-flop cells are used to implement a scan test.

Figure 1:
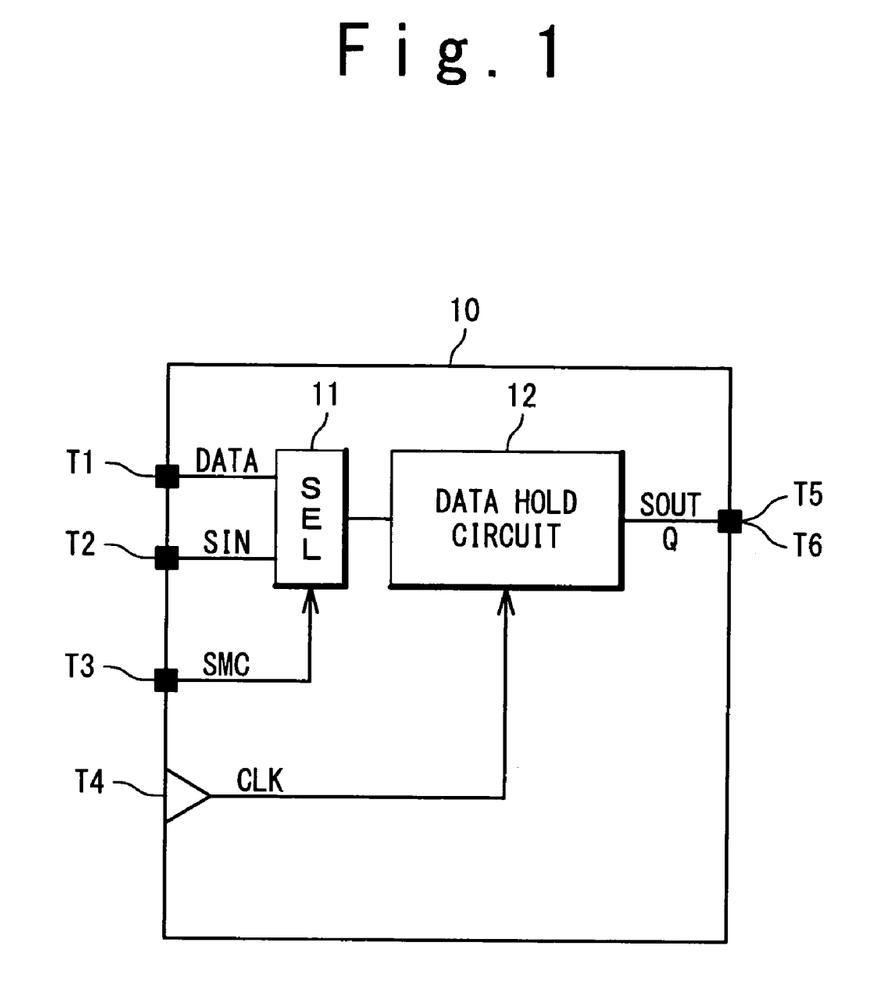
FIG. 1 is a schematic view showing an exemplary configuration of a scan flip-flop cell.

FIG. 1 schematically shows an exemplary configuration of scan flip-flop cells 10 used in this embodiment. The scan flip-flop cells 10 each have a data input terminal T1, a scan input terminal T2, an SMC (Scan Mode Control) terminal T3, a clock terminal T4, a scan output terminal T5 and a data output terminal T6. The data input terminal T1 and the data output terminal T6 are terminals connected to data signal lines. The clock terminal T4 is a terminal connected with a clock line to receive a clock signal CLK. The scan input terminal T2 and the scan output terminal T5 are terminals to be connected to a scan chain (or a scan path) and used in implementing a scan test. Specifically, the scan input terminal T2 of a certain scan flip-flop cell 10 is connected to the scan output terminal T5 of another scan flip-flop cell 10 at the previous stage of the scan chain, and the scan output terminal T5 of a certain scan flip-flop cell 10 is connected to the scan input terminal T2 of another scan flip-flop cell 10 at the latter stage of the scan chain. The SMC terminal T3 is a terminal receiving an SMC signal for switching between a normal operation mode and a scan test mode. When the normal operation mode is selected, the input from the data input terminal T1 is selected. On the other hand, the input from the scan input terminal T2 is selected when the scan test mode is selected. In one embodiment, a terminal may be commonly used as the scan output terminal T5 and the data output terminal T6 as shown in FIG. 1. In an alternative embodiment, the scan output terminal T5 and the data output terminal T6 may be separately prepared within the respective scan flip-flop cells 10.

The scan flip-flop cells 10 each include a select circuit 11 and a data hold circuit 12. The select circuit 11 receives data from the data input terminal T1 and the scan input terminal T2, and also receives the SMC signal from the SMC terminal T3. In response to the mode specified by the SMC signal, the select circuit 11 selects the data received from the data input terminal T1 and the scan input terminal T2, and outputs the selected data to the data hold circuit 12. The data hold circuit 12 receives the selected data from the select circuit 11 and also receives the clock signal CLK from the clock terminal T4. In response to the clock signal CLK, the data hold circuit 12 latches the selected data, and outputs the latched data to the scan output terminal T5 and the data output terminal T6. The data hold circuit 12 may be structured as a commonly used flip-flop. In one embodiment, the data hold circuit 12 is provided with latch circuits and a transfer gate.

As thus described, the terminals T1 to T6 are each connected with any of the elements within the scan flip-flop cell 10 through the inner interconnections. The scan flip-flop cells 10 are operated in response to the clock signal CLK.

Design change is often requested in the circuit design procedure or after the circuit design procedure is once completed. One requirement is to achieve design change in a short time without deteriorating the failure detection quality, and therefore, a technique is desired which allows additionally incorporating above-mentioned scan flip-flop cells 10. In order to satisfy this requirement, spare cells which are designed to be easily replaced with scan flip-flop cells 11 are placed in advance in the cell placement of the circuit design in this embodiment. As described later, the spare cells do not operate as a flip-flop, while structured similarly to the scan flip-flop cells 10. In this meaning, the spare cells are referred to as dummy block cells, hereinafter.

As described later, dummy block cells used in this embodiment are featured in suitability for being replaced with scan flip-flop cells 10. In the circuit design, dummy block cells that can be easily replaced with scan flip-flop cells 10 are placed. When the design change of the circuit to be designed is requested, one or more dummy block cells are replaced with one or more scan flip-flop cell 10. This allows easily incorporating additional scan flip-flop cells 10, achieving the design change in a short time.

Figure 2A:
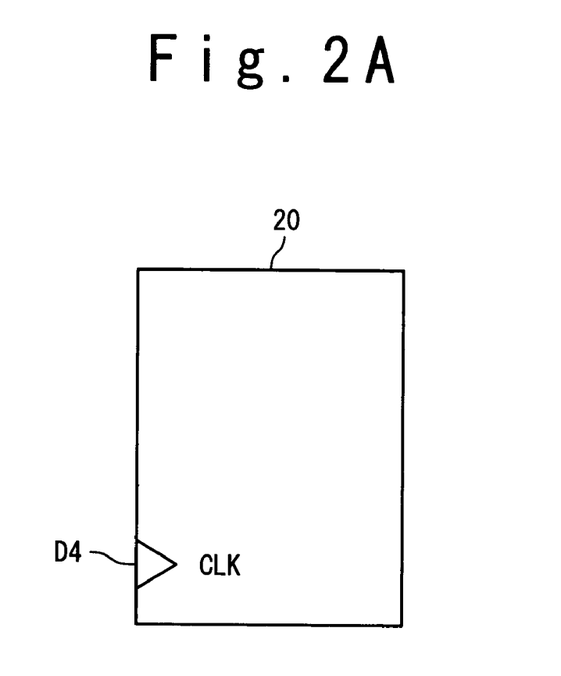
FIGS. 2A and 2B are schematic views showing exemplary configurations of a dummy block cell before DFT synthesis.
Figure 2B:
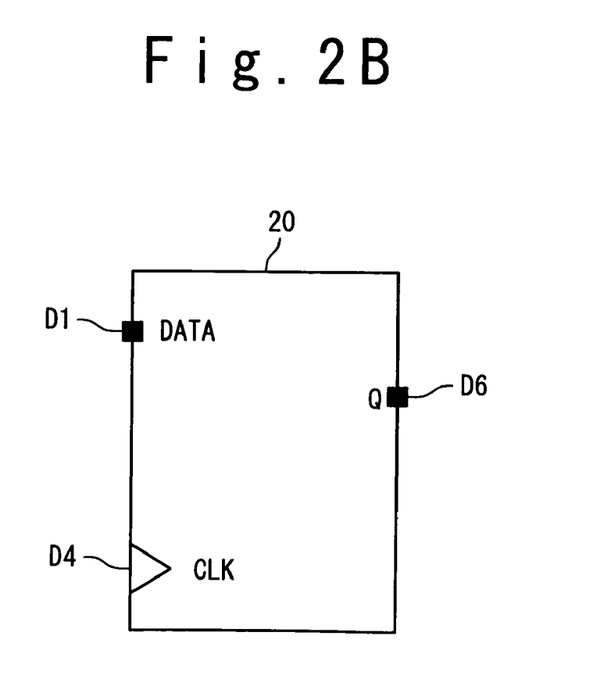
Figure 3A:
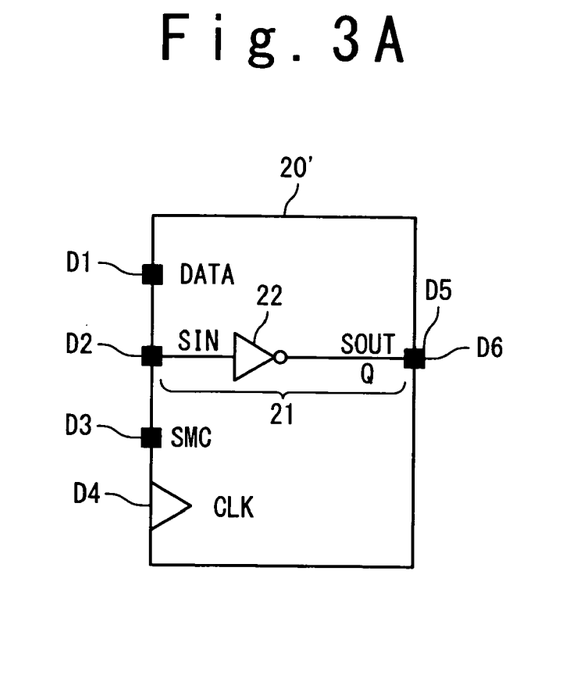
FIGS. 3A and 3B are schematic views showing example configurations of a dummy block cell after the DFT synthesis.
Figure 3B:
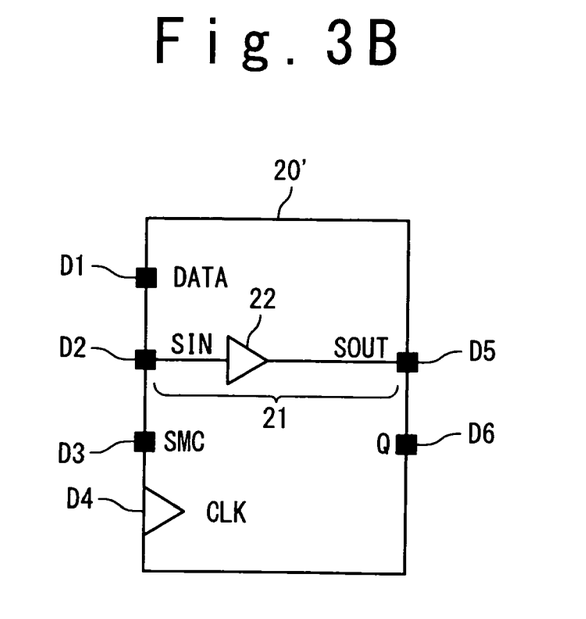

FIGS. 2A, 2B, 3A and 3B show exemplary configurations of dummy block cells used in this embodiment. FIGS. 2A and 2B show exemplary configurations of dummy block cells 20 before DFT synthesis, and FIGS. 3A and 3B show exemplary configurations of dummy block cells 20', which are adapted to the scan test after the DFT synthesis.

In FIGS. 2A, 2B, 3A and 3B, terminals D1 to D6 of the dummy block cells correspond to the terminals T1 to T6 in the scan flip-flop cell 10, respectively. In detail, the dummy input terminal D1 and the dummy output terminal D6 correspond to the data input terminal T1 and the data output terminal T6, respectively. The dummy clock terminal D4 is a terminal connected to a clock line to receive the clock signal CLK inputted thereto. The scan input terminal D2 and the scan output terminal D5 are terminals to be connected with scan data lines within the scan chain (or the scan path) and used in the scan test. In the scan test, a scan pattern (test pattern) is fed to the scan input terminal D2 and outputted from the scan output terminal D5. The dummy SMC terminal D3 corresponds to the SMC terminal T3.

In one embodiment, as shown in FIG. 2A, the dummy block cells 20 before the DFT synthesis each have a dummy clock terminal D4. In an alternative embodiment, as shown in FIG. 2B, the dummy block cells 20 may each have the dummy input terminal D1 and the dummy output terminal D6 in addition to the dummy clock terminal D4.

As shown in FIGS. 3A and 3B, the dummy block cells 20' after the DFT synthesis each have a dummy input terminal D1, a scan input terminal D2, a dummy SMC terminal D3, a dummy clock terminal D4, a scan output terminal D5 and a dummy output terminal D6. One terminal may be commonly used as the scan output terminal D5 and the dummy output terminal D6 as shown in FIG. 3A. Alternatively, the scan output terminal D5 and the dummy output terminal D6 may be separately provided as shown in FIG. 3B.

The dummy block cells 20' in this embodiment do not operate as a flip-flop, although the cell frame shape thereof is similar to that of the scan flip-flop cell 10 shown in FIG. 1. Instead of operating as a flip-flop, the dummy block cells 20' each have a through path 21 for providing a connection between the scan input terminal D2 and the scan output terminal D5. The through path 21 transfers data independently of the clock signal CLK. The through path 21 may include a combination circuit 22, such as a buffer and an inverter, which operates independently of the clock signal CLK. In the example shown in FIGS. 3A and 3B, the combination circuit 22 (an inverter or a buffer) is connected between the scan input terminal D2 and the scan output terminal D5. FIG. 3A shows the case where the combination circuit 22 is composed of an inverter, while FIG. 3B shows the case where the combination circuit 22 is composed of a buffer.

The dummy block cells 20' thus structured are design to output to the scan output terminal D5 data corresponding to the input data fed to the scan input terminal D2 independently of the clock signal CLK. Although having the dummy clock terminal D4 receiving the clock signal CLK, the dummy block cells 20' operates independently of the clock signal CLK. This effectively reduces the power consumption of the dummy block cells 20', compared to the case where dummy cells having the same configuration as normal scan flip-flop cells are used.

In light of the requested function, the configuration within the dummy block cells 20' only requires elements and interconnections which form the through path 21; the terminals except the scan input terminal D2 and the scan output terminal D5 are not required to be connected to elements and interconnections within the dummy block cell 20'. In other words, the dummy input terminal D1, the dummy SMC terminal D3, and the dummy clock terminal D4 are allowed to be internally open. In this case, the routing inhibition region within the dummy block cell 20' is extremely decreased as compared with the case where dummy cells of the same configuration as the scan flip-flop cells 10 are used, thereby improving the easiness of the interconnection routing.

Preferably, the positional relation among the terminals D1 to D6 in the dummy block cells 20' is same as the positional relation among the terminals T1 to T6 in the scan flip-flop cells 10. Specifically, the dummy block cells 20' preferably have the same dimensions as the scan flip-flop cells 10. Moreover, the relative positions of the terminals D1 to D6 in the dummy block cells 20' are preferably equal to the relative positions of the terminals T1 to T6 in the scan flip-flop cells 10. Such arrangement of the dummy block cells 20' improves easiness in the replacement of dummy block cells 20' with scan flip-flop cells 10.

It is also preferable that the dummy block cells 20' are designed so that the input capacitance of the dummy clock terminals D4 in the dummy block cells 20' is equal to that of the clock terminals T4 in the scan flip-flop cells 10. This eliminates the need of performing clock tree synthesis again, after dummy block cells 20' are replaced with the scan flip-flop cells 10.

Figure 4:
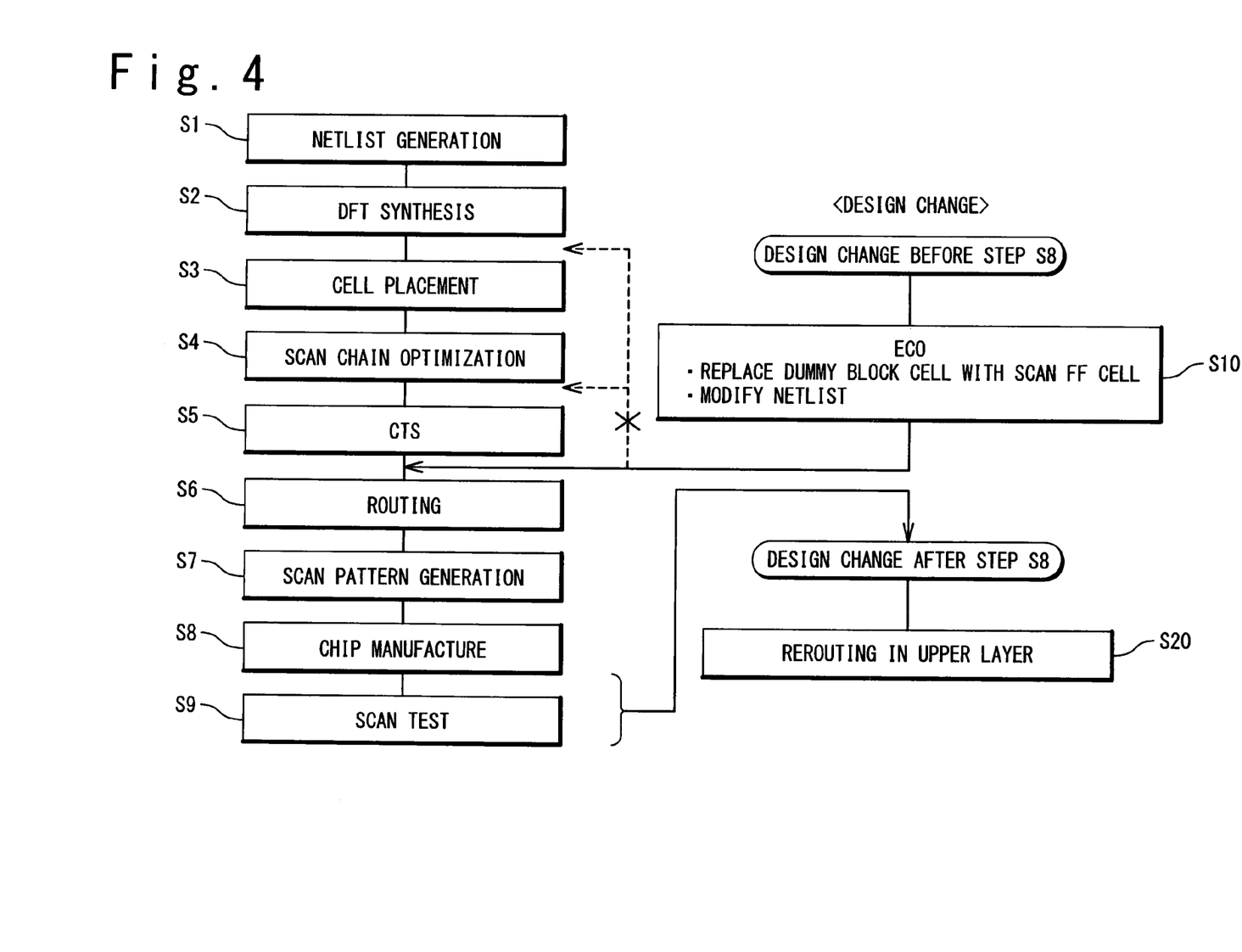
FIG. 4 is a flowchart showing a method of designing a semiconductor integrated circuit in one embodiment of the present invention.

FIG. 4 is a flowchart showing an exemplary procedure of semiconductor integrated circuit design in this embodiment. In the following, a description is given of an exemplary circuit design procedure based on scan flip-flop cells 10 and dummy block cells 20', with reference to FIG. 4, Step S1:

First, a netlist of the circuit to be design is prepared. The netlist describes kinds of respective cells within the circuit to be designed and connections between the cells. The cells within the circuit to be designed may include NAND cells, inverter cells, and flip-flop cells, for example.

This is followed by inserting dummy block cells 20 shown in FIG. 2A or 2B (before DFT synthesis) at proper positions in the circuit to be designed, and updating the netlist accordingly. As described above, this addresses facilitating a future circuit design change (in particular, a change involving addition of flip-flop cells).

Step S2:

Next, DFT synthesis is carried out, and the netlist is updated accordingly. Specifically, at least some of the flip-flop cells described in the netlist are replaced with scan flip-flop cells 10 shown in FIG. 1. In addition, the dummy block cells 20 described in the netlist are replaced with the dummy block cell 20' shown in FIG. 3A or 3B. In this DFT synthesis, a tentative scan chain (or a tentative scan path) is established in the netlist so that the tentative scan chain incorporate the dummy block cells 20' together with the scan flip-flop cells 10. The netlist after the DFT synthesis is prepared in this way.

In other words, the DFT synthesis involves replacing flip-flop cells and the dummy block cells 20 with the scan flip-flop cells 10 and the dummy block cells 20' so as to form a scan chain for the test. Alternatively, when the dummy block cells 20' shown in FIG. 3A or 3B are described in the netlist in advance at the step S1, or dummy block cells each containing at least a scan input terminal, a scan output terminal and a clock terminal as shown in FIG. 2B are used at the step S1, the replacement of the dummy block cells are not implemented at the step S2. The establishment of the scan path only requires the dummy block cell to contain at least a scan input terminal, a scan output terminal and a clock terminal.

The connection destinations of the terminals D1 to D6 of the dummy block cells 20' are described in the netlist. For example, the connection destinations of the terminals D1 to D6 of the dummy block cells 20' are described in the netlist as follows: The dummy clock terminal D4 is connected to a clock line. The scan input terminal D2 is connected to the scan output terminal (T5 or D5) of another cell through a scan data line. The scan output terminal D5 is connected to the scan input terminal (T2 or D2) of still another cell through another scan line. On the other hand, the dummy input terminal D1 and the dummy SMC terminal D3 are connected to nowhere. When the scan output terminal D5 and the dummy output terminal D6 are separately prepared, the dummy output terminal D6 is defined as being connected to nowhere.

The dummy block cells 20' used in this embodiment are featured as follows: The scan input terminal D2 and the scan output terminal D5 are connected through the through path 21, while the terminals other than the scan input terminal D2 and the scan output terminal D5 are not connected to any element or interconnection within the dummy block cells 20'. In other words, the dummy input terminal D1, the dummy SMC terminal D3, and the dummy clock terminal D4 are internally open. In addition, the dummy block cells 20' have the same size or dimensions as the scan flip-flop cells 10.

Furthermore, the dummy block cells 20' are designed so that the input capacitance of the dummy clock terminal D4 is equal to that of the clock terminal T4 in the scan flip-flop cells 10. Moreover, the positional relation among the terminals D1 to D6 in the dummy block cells 20' is equal to the positional relation among the terminals T1 to T6 in the scan flip-flop cells 10. In other words, the dummy block cells 20' are designed so that, when a dummy block cell 20' and a scan flip-flop cell 10 are placed overlapped, the corresponding terminals are located at the same positions (in other words, overlapped), respectively. It should be noted that, when the dummy block cells 20' each only contain a scan input terminal, a scan output terminal and a clock terminal, the dummy block cells 20' are designed so that the scan output terminal and the clock terminal are positioned overlapped on the corresponding terminals of the scan flip-flop cells 10, respectively.

Figure 5:
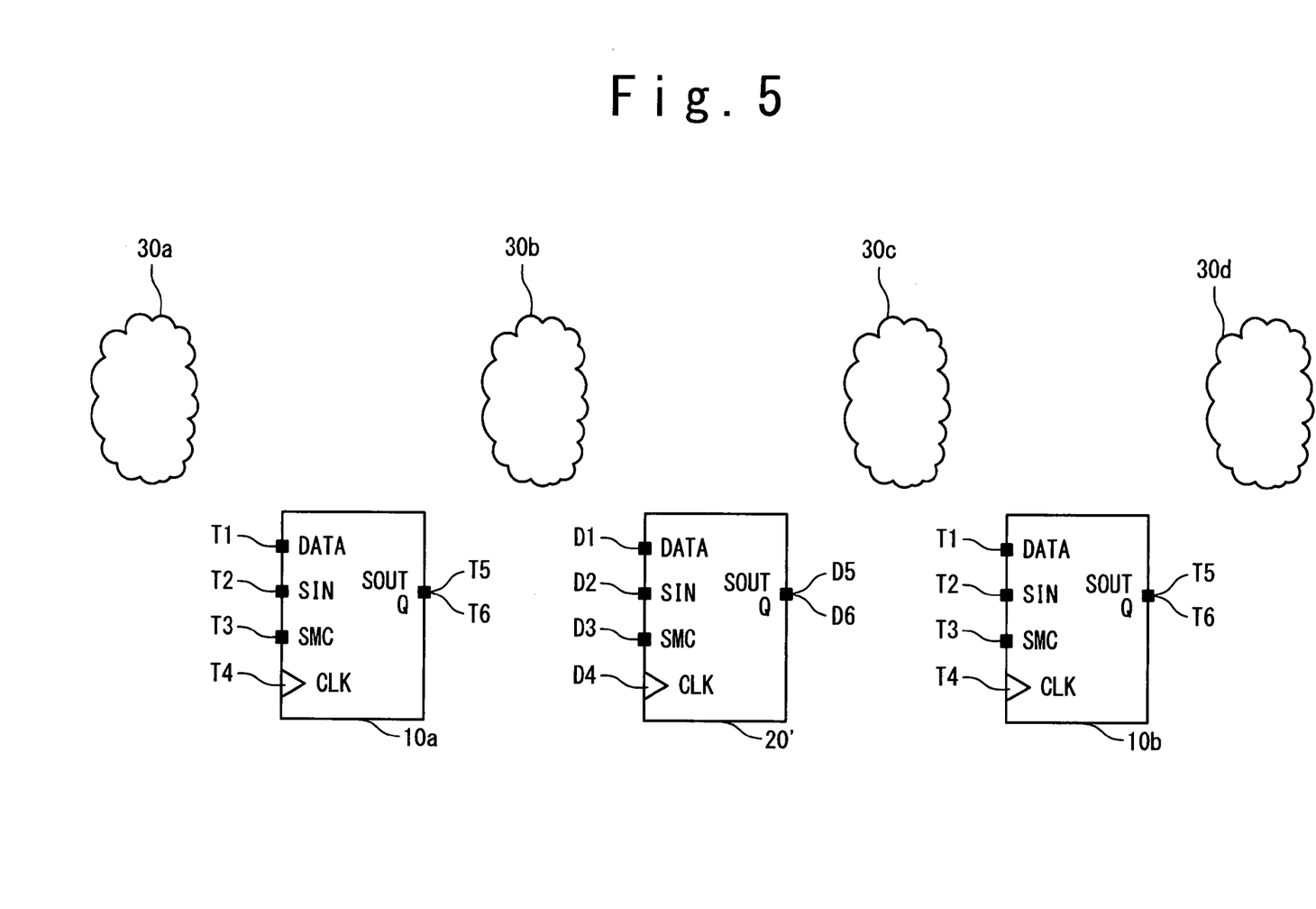
FIG. 5 is a schematic view showing one example of cell placement.

Step S3:

Next, the cell placement is carried out in accordance with the netlist. In the cell placement, the cells described in the netlist, including the foregoing scan flip-flop cells 10 and dummy block cells 20', are read from a cell library and placed in the layout region of the circuit to be designed. In the cell placement, the dummy block cells 20' are handled in the same way as the scan flip-flop cells 10. FIG. 5 schematically shows one example of the cell placement. In the arrangement shown in FIG. 5, scan flip-flop cells 10a, 10b and a dummy block cell 20' are placed in the layout region. In addition, logic circuits 30a, 30b, 30c and 30d are placed.

Step S4:

After the cell placement, the above-described tentative scan chain is optimized. This process is generally referred to as scan re-chain. Specifically, the connection order of the scan flip-flop cells 10 and the dummy block cells 20' within the scan chain is changed in accordance with the placement data generated at the step S3. At the step S4, the dummy block cells 20' are handled in the same way as the scan flip-flop cells 10.

Step S5:

The clock tree synthesis (CTS) is then executed for the adjustment of the clock timing. The CTS establishes a clock distribution network for supplying clock signals to sequential circuits, such as scan flip-flop cells, so that the clock skew is as reduced as possible. Also at the step 5, the dummy block cells 20' are handled in the same way as the scan flip-flop cells 10; the CTS involves not only the scan flip-flop cells 10 but also the dummy block cells 20'. That is, the CTS is commonly performed for cells including at least the scan flip-flop cells 10 and the dummy block cells 20'. As a result, the clock skew is reduced below a desired value or less for both of the scan flip-flop cells 10 and the dummy block cells 20'. The clock signal CLK is supplied to the scan flip-flop cells 10 and the dummy block cells 20' with the same phase.

Figure 6:
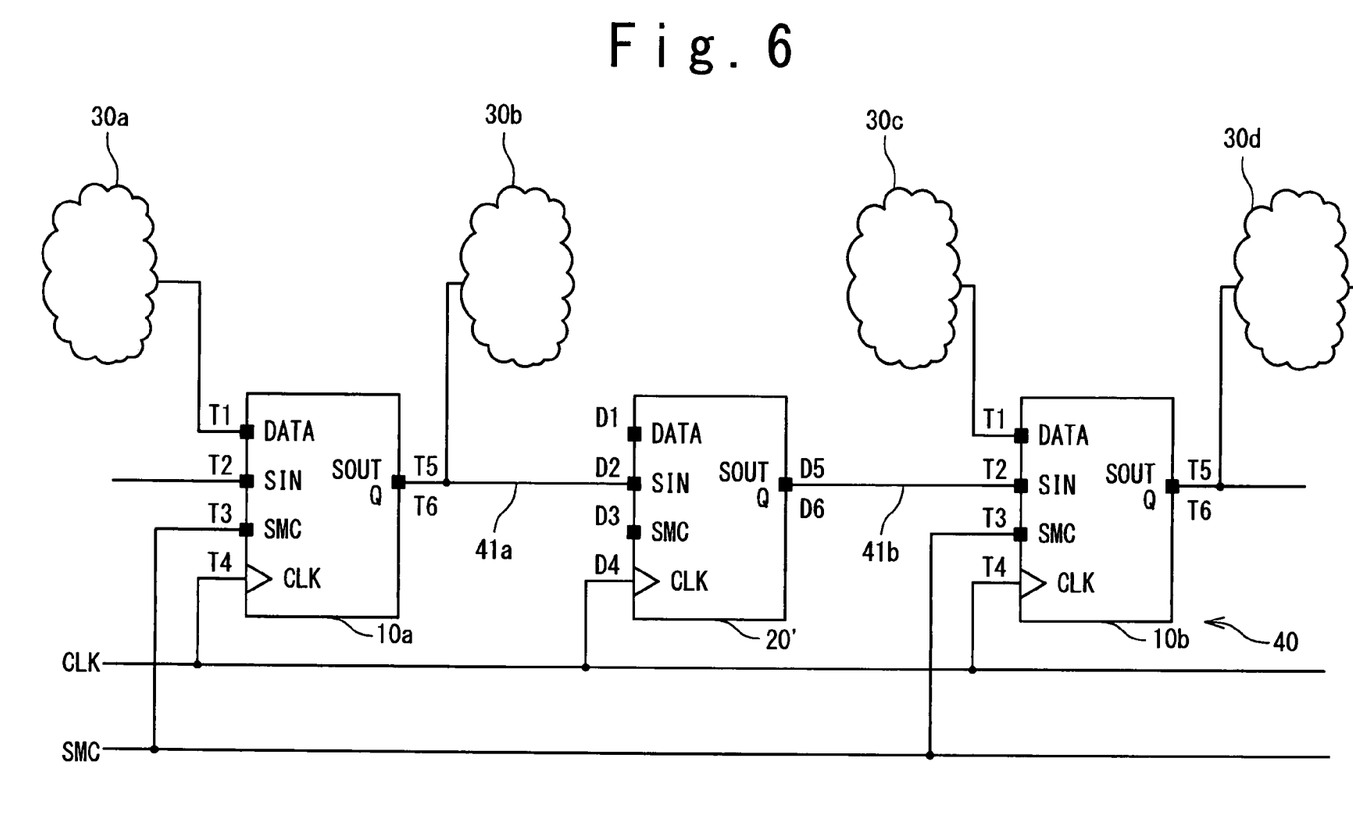
FIG. 6 is a schematic view showing one example of routing among cells.

Step S6:

Subsequently, interconnection routing between the cells placed in the layout region is carried out at the step S6 in accordance with the netlist and the results of the steps S4 and S5. It should be noted that the dummy block cells 20' are handled in the same way as the scan flip-flop cells 10 in the routing at the step S6. FIG. 6 schematically shows an exemplary layout of a scan chain 40 within the circuit to be designed after the routing, corresponding to the cell arrangement shown in FIG. 5. In the example shown in FIG. 6, the connections among of the cells are as follows:

The data input terminal T1 of the scan flip-flop cell 10a is connected to the output of the logic circuit 30a. The scan input terminal T2 is connected to the scan output terminal (T5 or D5) of another cell (not shown) at the previous stage of the scan chain 40. The SMC terminal T3 is connected to a SMC line, which distributes the SMC signal. The clock terminal T4 is connected to the clock line (or the clock tree line) to receive the clock signal CLK. The scan output terminal T5 is connected to the scan input terminal D2 of the dummy block cell 20' through a scan data line 41a. The data output terminal T6 is connected to the input of the logic circuit 30b.

The data input terminal T1 of the scan flip-flop cell 10b is connected to the output of the logic circuit 30c. The scan input terminal T2 is connected to the scan output terminal D5 of the dummy block cell 20' through a scan data line 41b. The SMC terminal T3 is connected to the SMC line. The clock terminal T4 is connected to the clock line. The scan output terminal T5 is connected to the scan input terminal (T2 or D2) of another cell (not shown) at the latter stage of the scan chain 40. The data output terminal T6 is connected to the input of the logic circuit 30d.

The dummy clock terminal D4 of the dummy block cell 20' is connected to the clock line to receive the clock signal CLK. The scan input terminal D2 is connected to the scan output terminal T5 of the scan flip-flop cell 10a through the scan data line 41a. The scan output terminal D5 is connected to the scan input terminal T2 of the scan flip-flop cell 10b through the scan data line 41b. As thus described, the scan chain 40 is established, including not only the scan flip-flop cells 10 but also the dummy block cells 20'. In other words, at least one dummy block cells 20' is incorporated within into the scan chain 40 in addition to the scan flip-flop cells 10.

The scan input terminals (T2, D2) and scan output terminals (T5, D5) of the respective cells are connected to scan data lines within the scan chain 40, and the clock terminals (T4, D4) of the respective cells are connected to the clock line. The scan flip-flop cells 10 operate as a normal flip-flop in response to the clock signal CLK received from the clock line. On the other hand, the dummy block cells 20' operate independently of the clock signal CLK, although receiving the clock signal CLK; the dummy block cells 20' only output the input data fed to the scan input terminal D2 to the scan output terminal D5 through the through path 21. Such operation effectively reduces the power consumption of the dummy block cells 20' as compared with the case where dummy cells having the same configuration as the scan flip-flop cells 10 are used.

It should be also noted that the terminals except the scan input terminal D2 and the scan output terminal D5 are not connected to any element or interconnection within the dummy block cells 20'. This effectively reduces the routing inhibition region in the dummy block cell 20' as compared with the case where dummy cells having the same configuration as the scan flip-flop cell 10s are used, and thereby improves the easiness of the routing.

Moreover, the terminals (block terminals) other than the dummy clock terminal D4, the scan input terminal D2 and the scan output terminal D5 are allowed to be externally open. In other words, the dummy input terminal D1 and the dummy SMC terminal D3 are not required to be connected to any interconnections outside the dummy block cells 20'. This is because the terminals D1 and D3 are connected to nowhere within the dummy block cells 20' and unnecessary for the circuit operations. Thus, the use of the dummy block cells 20' thus configured effectively reduces the burden on the routing, as compared with the case where dummy cells having the same configuration as the scan flip-flop cells 10 are used. Also, the above-described configuration of the dummy block cells 20' effectively improves the easiness of the routing around the dummy block cells 20'.

As the result of the routing, the layout data which indicate the layout of the circuit to be designed are generated. After the generation of the layout data, layout verification and timing verification are implemented. When any fault is founded by the layout and timing verifications, placement and routing are performed again to modify the layout data.

Step S7:

Also, a scan pattern (or a test pattern) for a scan test is generated in accordance with the netlist. In the generation of the scan pattern, the dummy block cells 20' are treated as incorporating the through paths 21, differently from the scan flip-flop cells 10. The scan pattern is generated by, for example, an ATPG (Automatic Test Pattern Generator). The scan pattern is generated so as to achieve a desired failure detection probability.

Step S8:

After the completion of the layout data, the designed semiconductor integrated circuit is manufactured. Specifically, mask data of the designed circuit are prepared in accordance with the layout data. Subsequently, reticles corresponding to the mask data are prepared by an electron beam drawing technique. The semiconductor integrated circuit (or the semiconductor chip) is manufactured through photolithography steps using the reticles prepared and other processes.

Figure 7A:
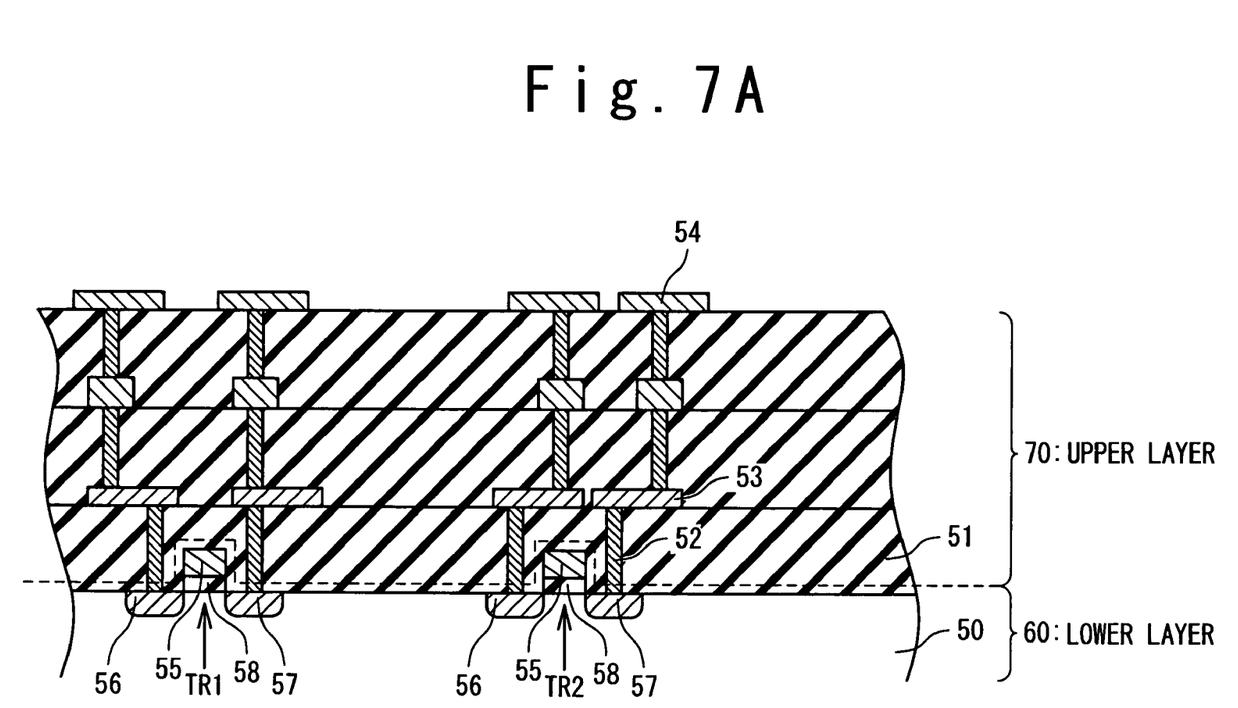
FIG. 7A is a sectional view showing an exemplary structure of lower layers of a semiconductor integrated circuit.
Figure 7B:
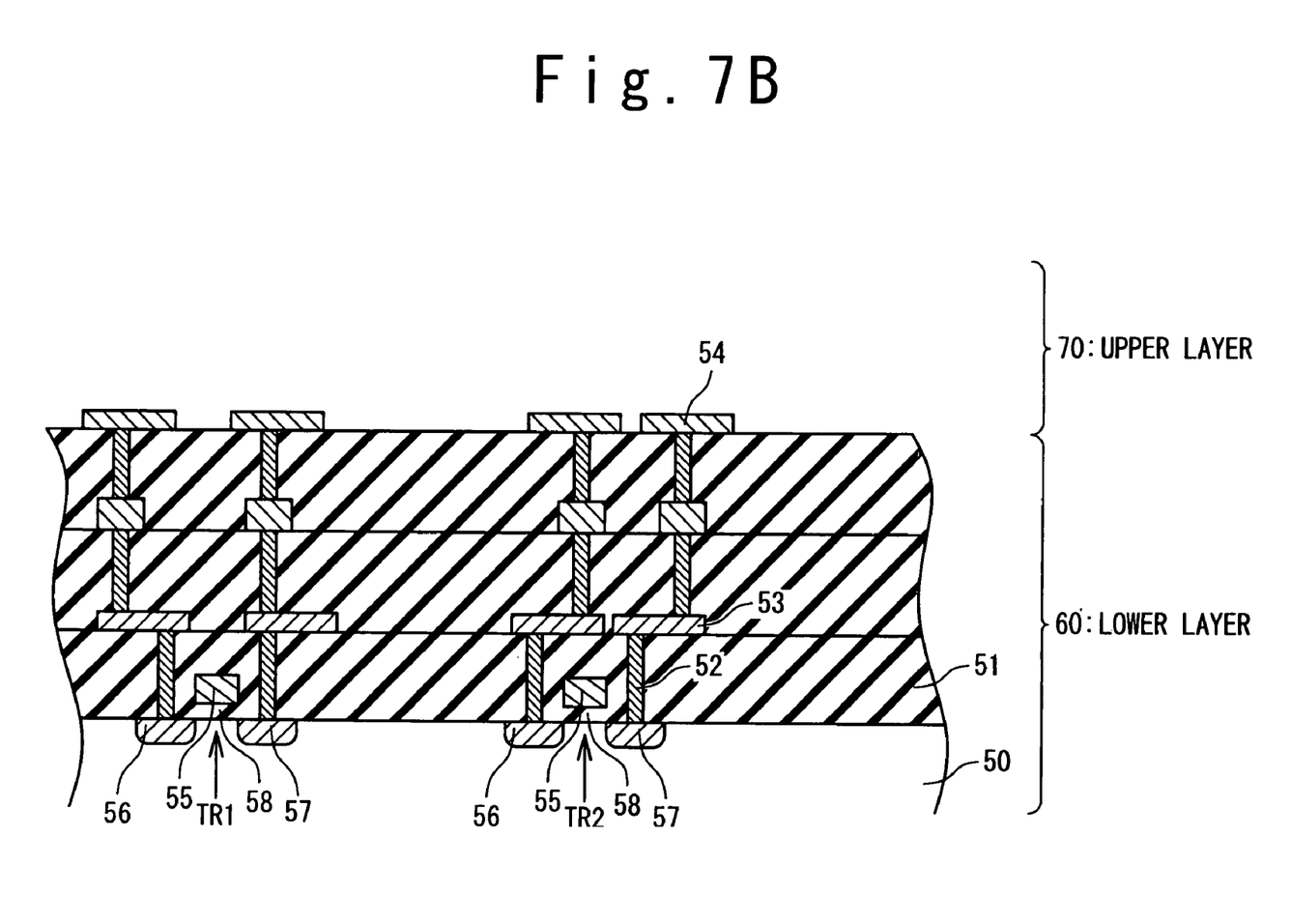
FIG. 7B is a sectional view showing another exemplary structure of lower layers of a semiconductor integrated circuit.

FIGS. 7A and 7B show the structure of the manufactured integrated circuit, especially the structure of a lower layer 60 and an upper layer 70 within the integrated circuit. In FIGS. 7A, 7B, transistors TR1 and TR2 are formed within surface portions of a semiconductor substrate 50. The transistors TR1 and TR2 each include a gate 55, a source 56, a drain 57 and a gate dielectric film 58 formed between the gate 55 and the semiconductor substrate 50. Here, the gates 55 are made of, for example, polysilicon and the like. Also, an interlayer dielectric film 51 is formed to cover the transistors TR1 and TR2. Via contacts 52 are formed to penetrate the interlayer dielectric film 51, providing electrical connections to the diffusion layers (the sources 56 or drains 57) of the transistors. Multiple interconnection layers are formed within the integrated circuit, and interconnections 53 connected with the via contacts 52 are formed in the lowest one of the interconnection layers.

The lower layer 60 is defined as at least including a portion in which the transistors are formed. For example, in FIG. 7A, the lower layer 60 is defined as the portion below the dotted line. Alternatively, as shown in FIG. 7B, the lower layer 60 may be defined as additionally including one or more interconnection layers.

On the other hand, the upper layer 70 is defined as including one or more interconnection layers positioned above the lower layer 60. A plurality of transistors are integrated within the lower layer 60, and various functions can be attained by connections of upper layer interconnections 54 in the upper layer 70; different functions can be attained by different connections of the upper layer interconnections 54 in the upper layer 70 for the same structure of the lower layer 60.

The structures (or the layouts) of the lower and upper layers 60 and 70 in each cell are determined when each cell is characterized. In a preferred embodiment, the dummy block cells 20' are structured to incorporate a transistor structure (arrangement of transistors and connections therebetween) adapted to the function of scan flip-flop cells 10 in the lower layer 60. In other words, the dummy block cells 20' preferably incorporate the same transistor structure (the lower layer structure) as the scan flip-flop cells 10 in the lower layer 60. This allows the dummy block cells 20' to operate as the scan flip-flop cells 10 only by changing the connections of the upper layer interconnections 54 in the upper layer 70.

Step S9:

After the integrated circuit is manufactured within a semiconductor chip, the scan chain and the scan pattern (test pattern) prepared at the step S7 are used to carry out the scan test. If the result of the scan test is failed for a semiconductor chip, the semiconductor chip is removed as a fault product. The fail of the semiconductor chip may result in the circuit design. In such case, design change is required.

Design Change Procedure

The process in the design change (function modification) will be described below. The design change may be requested while the circuit design is going on or after the circuit design is once completed. In this embodiment, the design change procedure is different depending on the occurrence stage of the design change.

Step S10:

When design change is requested before the manufacture (Step S8), an "ECO" (Engineering Change Order) is implemented, which implies the layout change process involving the change of the netlist (namely, the circuit connection change), including cell replacement and the like.

In this embodiment, one or more dummy block cells 20', which are previously placed, are replaced with one or more scan flip-flop cells 10 in accordance with the necessity. Specifically, the block name (or cell name) of a dummy block cell 20' to be replaced is changed to a block name of the scan flip-flop cell 10 in the netlist. It should be noted that the block name is the name given to each cell or block. The block name is used to define correlation of the cell of interest with library data, such as layout data of the cell. In addition, connection destinations of the terminals of the newly added scan flip-flop cell(s) 10 are added to the netlist. The netlist is updated in this way. After the update of the netlist, the process returns back to the step S6. At the step S6, the routing is carried out again in accordance with the updated netlist. This is followed by generating a scan pattern for the updated netlist (Step S7).

Figure 8:
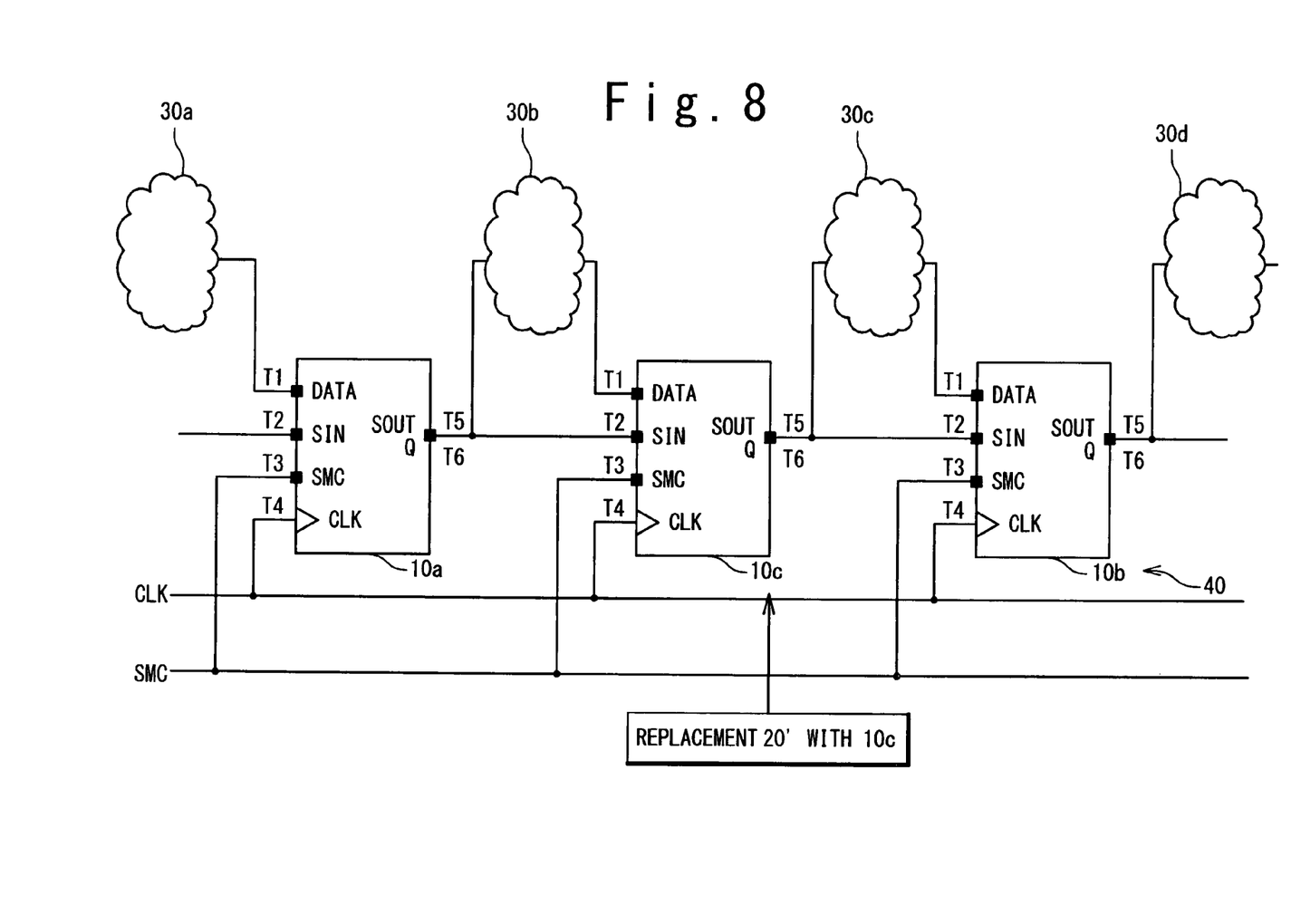
FIG. 8 is a schematic view showing an exemplary circuit layout after replacement of a dummy block cell with a scan flip-flop cell.

FIG. 8 is a view schematically showing one example of the cell replacement implemented for the circuit arrangement shown in FIG. 6. In FIG. 8, the dummy block cell 20' of FIG. 6 is replaced with a scan flip-flop cell 10c. The data input terminal T1 of the scan flip-flop cell 10c is connected to, for example, the output of the logic circuit 30b. The data output terminal T6 is connected to, for example, the input of the logic circuit 30c. The SMC terminal T3 is connected to the SMC line.

In this example, the dummy block cells 20' have the same size or dimensions as the scan flip-flop cells 10 and have the same kind of terminals D1 to D6 as the scan flip-flop cell 10. Therefore, the replacement of the dummy block cell 20' with the scan flip-flop cell 10 is achieved only changing the block name in the netlist; in the design change, the cell placement (Step S3) is not required to be performed again.

It should be noted that the positional relation among the terminals D1 to D6 in the dummy block cells 20' is same as that among the terminals T1 to T6 in the scan flip-flop cells 10. This eliminates the need for rerouting the interconnections connected to the scan input terminal T2, the clock terminal T4 and the scan output terminal T5 for the newly-added scan flip-flop cell 10c, effectively reducing the burden necessary for the interconnection routing in the design change procedure.

It should be also noted that the input capacitance of the clock terminal T4 of the scan flip-flop cell 10c is equal to the input capacitance of the dummy clock terminal D4 of the dummy block cell 20', and that no change in the routing of the interconnection connected to the clock terminal T4 with respect to the scan flip-flop cell 10c. This implies that the cell replacement has no influence on the clock timing, and the clock skew is not changed before and after the cell replacement. On the other hand, the CTS process is already performed on the dummy block cell 20' and the clock timing is matched between the dummy block cell 20' and other cells at the step S5. Hence, the clock timing is also matched between the newly-added scan flip-flop cell 10c and the other cells. In the design change, the CTS (Step S5) is not required to be performed again.

As mentioned above, the dummy block cell 20' is replaced by the scan flip-flop cell 10 with reduced design modification in this embodiment; the design change procedure of this embodiment allows easily adding a scan flip-flop cell 10 to complete the design change in a short time. The design change procedure of this embodiment does not require performing the cell placement (Step S3) and the CTS (Step S5) again. This effectively reduces the design TAT compared with the conventional technique.

Step S20:

Next, let us consider a case that the design change occurs at or after the manufacture stage (Step S8). In this embodiment, the dummy block cells 20' have the transistor structure adapted to provide the functions of the scan flip-flop cell 10 in the lower layer 60 in advance (refer to FIGS. 7A, 7B). In other words, the dummy block cells 20' have at least the same transistor structure as the scan flip-flop cells 10 in the lower layer 60. In the design change at or after the manufacture stage, the connections of the upper layer interconnections 54 of the dummy block cells 20' are modified in the upper layer 70 to allow the dummy block cells 20' to operate identically to the scan flip-flop cells 10. This allows virtually incorporating one or more additional scan flip-flop cells 10 into the circuit. As mentioned above, since the CTS process is already executed, the clock timing is matched between the newly added scan flip-flop cell(s) 10 and the other cells.

After that, the netlist is changed similarly to the case of the step S10, and the scan pattern is generated again (Step S7). The scan test is executed with the newly prepared scan pattern (Step S9).

The design change procedure in this embodiment eliminates the need for changing the structure of the lower layer 60, thereby largely reducing the working processes required to execute the design change. Therefore, the design change procedure in this embodiment allows completing design change in a short time. In addition, the design change procedure in this embodiment, in which the structure of the lower layer 60 is not changed, also eliminates the need for modifying the mask patterns developed on the reticles for the lower layer 60. This effectively reduces the cost required to execute the design change.

Circuit Design System

Figure 9:
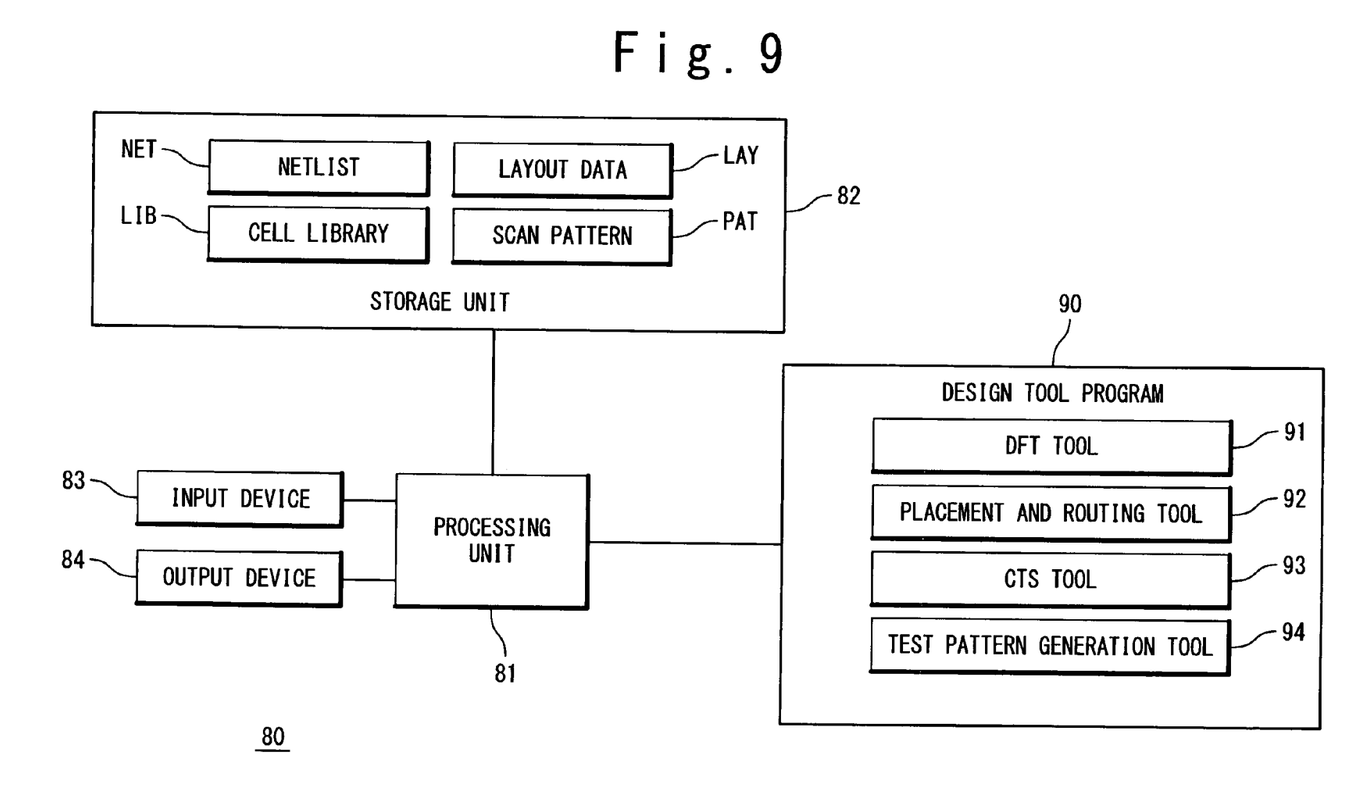
FIG. 9 is a block diagram showing an exemplary configuration of an integrated circuit design system in one embodiment of the present invention.

In one embodiment, the integrated circuit design procedure of this embodiment is implemented by using a circuit design system 80, which is a sort of computer system, as shown in FIG. 9. The circuit design system 80 is provided with a processing unit 81, a storage unit 82, an input device 83, an output device 84 and design tool programs 90. In one embodiment, the storage unit 82 is provided with an RAM and HDD. A keyboard and/or a mouse may be used as the input device 83, and a display device may be used as the output device 84.

The storage unit 82 is used to store therein a netlist NET, a cell library LIB, a layout data LAY and a scan pattern PAT and other data.

The design tool programs 90 are software programs executed by the processing unit 81. The design tool programs 90 may be installed onto the storage unit 82 from a computer-readable recording medium. The design tool programs 90 include a DFT tool 91, a placement-and-routing tool 92, a CTS tool 93, a test pattern generation tool 94 and other design tools. The DFT tool 91 provides the functions necessary for implementing the steps S2 and S4. The placement and routing tool 92 provides the functions necessary for implementing the steps S3 and S6. The CTS tool 93 provides the functions necessary for implementing the step S5. The test pattern preparing tool 94 provides the functions necessary for implementing the step S7.

The processing unit 81 executes the respective tools of the design tool programs 90 to consequently complete the circuit design procedure. Each tool reads necessary data and/or file from the storage unit 82 and writes generated data and file onto the storage unit 82. As a result, the above-mentioned circuit design procedure of this embodiment is implemented.

Configuration of Designed Integrated Circuit

Figure 10:
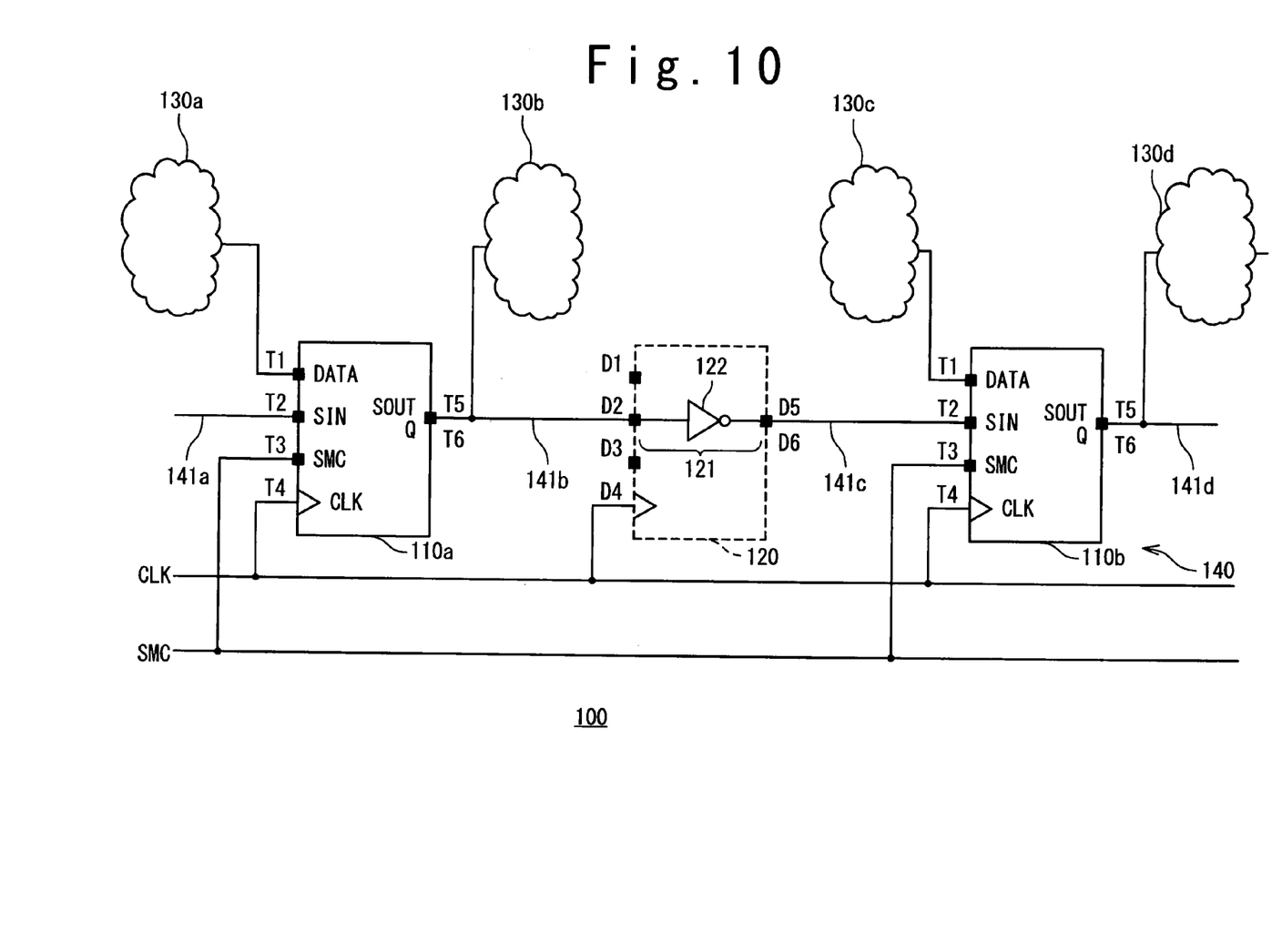
FIG. 10 is a circuit diagram showing an exemplary configuration of a designed semiconductor integrated circuit in one embodiment of the present invention.

FIG. 10 schematically shows an exemplary configuration of a semiconductor integrated circuit 100 designed by the circuit design procedure in this embodiment. A description is given of the semiconductor integrated circuit 100 in the following.

The semiconductor integrated circuit 100 shown in FIG. 10 includes scan flip-flops 110, a dummy block 120, and logic circuits 130. Although only two scan flip-flops 110 and one dummy block 120 is shown in FIG. 10, it would be understood that the number of the scan flip-flops 110 is not limited to two and the number of the dummy block 120 is not limited to one. The scan flip-flops 110 are the circuits corresponding to the scan flip-flop cells 10 and has the size corresponding to the scan flip-flop cells 10. The dummy block 120 is the circuit corresponding to the dummy block cell 20' which is left in the semiconductor integrated circuit 100 without being replaced. The dummy block 120 has the size and dimensions corresponding to the dummy block cell 20'. The scan flip-flops 110 and the dummy block 120 are connected to form a scan chain 140; the dummy block 120 remains within the scan chain 140.

The scan flip-flops 110 each have a data input terminal T1, a scan input terminal T2, an SMC terminal T3, a clock terminal T4, a scan output terminal T5 and a data output terminal T6. On the other hand, the dummy block 120 has a dummy input terminal D1, a scan input terminal D2, a dummy SMC terminal D3, a dummy clock terminal D4, a scan output terminal D5 and a dummy output terminal D6.

The data input terminal T1 of the scan flip-flop 110a is connected to the output of the logic circuit 130a. The scan input terminal T2 of the scan flip-flop 110a is connected to a scan data line 141a within the scan chain 140. The SMC terminal T3 of the scan flip-flop 110a is connected to the SMC line. The clock terminal T4 of the scan flip-flop 110a is connected to the clock line (the clock tree line) to receive the clock signal CLK. The scan output terminal T5 of the scan flip-flop 110a is connected to the scan data line 141b within the scan chain 140. The data output terminal T6 of the scan flip-flop 110a is connected to the input of the logic circuit 130b. In the configuration of FIG. 10, a single terminal is commonly used as the scan output terminal T5 and the data output terminal T6.

The data input terminal T1 of the scan flip-flop 110b is connected to the output of the logic circuit 130c. The scan input terminal T2 of the scan flip-flop 110b is connected to a scan data line 141c within the scan chain 140. The SMC terminal T3 is connected to the SMC routing. The clock terminal T4 of the scan flip-flop 110b is connected to the clock line. The scan output terminal T5 of the scan flip-flop 110b is connected to a scan data line 141d of the scan chain 140. The data output terminal T6 of the scan flip-flop 10b is connected to the input of the logic circuit 130d.

The dummy clock terminal D4 of the dummy block 120 is connected to the clock line to receive the clock signal CLK. The scan input terminal D2 of the dummy block 120 is connected to the scan output terminal T5 of the scan flip-flop 110a through the scan data line 141 within the scan chain 140. The scan output terminal D5 is connected to the scan input terminal T2 of the scan flip-flop 110b through the scan data line 141c within the scan chain 140. The other terminals (block terminals) are not connected to any interconnections outside the dummy block 120. In other words, the dummy input terminal D1 and the dummy SMC terminal D3 are externally open.

Within the dummy block 120, the scan input terminal D2 and the scan output terminal D5 are connected through a through path 121. Data are transferred over the through path 121, independently of the clock signal CLK; the data transfer over the through path 121 is not responsive to the clock signal CLK. The through path 121 may include a combination circuit 122 composed of a buffer, an inverter and the like. In the example shown in FIG. 10, the combination circuit 122 is connected between the scan input terminal D2 and the scan output terminal D5. On the other hand, the terminals except the scan input terminal D2 and the scan output terminal D5 are not connected to any elements or interconnections within the dummy block 120. In other words, the dummy input terminal D1, the dummy SMC terminal D3, and the dummy clock terminal D4 are internally open.

The dummy block 120 has the same size as the scan flip-flops 110; the dummy block 120, which includes the terminals D1 to D6, is formed in a region having the same size as the scan flip-flops 110. Moreover, the positional relation among the terminals D1 to D6 in the dummy block 120 is same as the positional relation among the terminals T1 to T6 in the scan flip-flop 110. Furthermore, the input capacitance of the dummy clock terminal D4 in the dummy block 120 is equal to that of the clock terminal T4 in the scan flip-flop 110.

Also, each of the scan flip-flops 110 and the dummy block 120 has the lower layer 60 and the upper layer 70 (See FIGS. 7A and 7B). The transistor structure of the dummy block 120 in the lower layer 60 is same as that of the scan flip-flops 110.

In the semiconductor integrated circuit 100 as mentioned above, the scan flip-flops 110 are configured to perform normal flip-flop operations in response to the clock signal CLK received from the clock line. The dummy block 120, on the other hand, operates independently of the clock signal CLK, although receiving the clock signal CLK; the operation of the dummy block 120 is not responsive to the clock signal CLK. The dummy block 120 only transfers data corresponding to the input data fed to the scan input terminal D2 through the through path 121 to the scan output terminal D5. Thus, the power consumption of the dummy block 120 is reduced, compare to the case where the dummy block has the same configuration as a normal scan flip-flop.

There is no need for additionally integrating a clock gating circuit for controlling the clock supply into the former stage of the dummy block 120, since the above-described configuration of the dummy block 120 effectively reduces electric power consumption. Thus, the configuration of the dummy block 120 in this embodiment allows making effective use of the chip resource, avoiding the increase in the chip size. The use of the dummy block 120 effectively reduces the electric power consumption without waste of the chip resource.

Advantages of Instant Circuit Design Technique

The following is advantages achieved by the integrated circuit design technique of this embodiment:

(1) Dummy blocks 120 left within the scan chain 140 of the product chip operate independently of the clock signal CLK although receiving the clock signal CLK. As a result, the power consumption of the dummy blocks 120 is largely reduced, compared to the case where the dummy blocks have the same configuration as normal scan flip-flops. The effect of the power consumption reduction for the entire chip is increased approximately proportional to the number of the placed dummy blocks 120. Thus, the power consumption reduction effect is enhanced with the increase in the circuit scale accompanied by the advance in the fine processing technique.

(2) The circuit design technique of this embodiment eliminates the need for additionally integrating a clock gating circuit for controlling the clock supply into former stages of the dummy blocks 120, since the power consumption of the dummy blocks 120 are reduced. This allows making effective use of the chip resource, avoiding the increase in the chip size. That is, the power consumption is reduced without waste of the chip resource. Also, the burden on the circuit design is decreased.

(3) The circuit design technique of this embodiment effectively improves the easiness of the routing at the step S6. For example, some of the terminals of respective dummy block cells 20' are not connected to any inner elements and interconnection (internally open). Thus, the routing inhibition region within the dummy block cell 20' is extremely decreased compared to the case where dummy cells have the same configuration as the scan flip-flop cells 10. As a result, the easiness of the routing is improved. Also, some of the terminals of the respective dummy block cells 20' are not connected to any external elements and interconnections (that is, externally open). This effectively reduces the burden on the routing process, improving the easiness of the routing around the dummy block cells 20'.

(4) The circuit design procedure of this embodiment allows integrating an increased number of dummy block cells 20' into the circuit to be designed, due to the reduced power consumption and the easiness of the routing of the dummy block cells 20'. In other words, constraints on the arrangement of the dummy block cells 20' are relaxed. This effectively improves the easiness of the circuit design and the design change.

(5) The circuit design technique of this embodiment allows easily replacing the dummy block cells 20' with the scan flip-flop cell 10. Therefore, the time necessary for the design change is effectively reduces.

For example, the dummy block cells 20' have the same size as the scan flip-flop cells 10 and each have the terminals D1 to D6 corresponding to as the terminals T1 to T6 of the scan flip-flop cell 10. This allows easily replacing a dummy block cell 20' with a scan flip-flop cell 10, by changing the block name described in the netlist. This eliminates the need for implementing the cell placement (Step S3) in the design change procedure.

Also, the positional relation among the terminals D1 to D6 within the dummy block cells 20' is equal to the positional relation among the terminals T1 to T6 within the scan flip-flop cells 10. This allows using already-connected interconnections after the replacement with respect to some of the terminals of the scan flip-flop cells 10; rerouting is not required for the some terminals. This effectively reduces the burden on the routing process in the design change.

Moreover, the input capacitance of the clock terminal T4 of the scan flip-flop cells 10 after the replacement is equal to the input capacitance of the dummy clock terminals D4 of the dummy block cells 20'. Also, there is no change in the interconnections connected to the clock terminals T4 of the scan flip-flop cells 10. Thus, the cell replacement has no influence on the clock timing, and the clock skew is not changed before and after the cell replacement. The clock timing is matched among the dummy block cells 20' and other cells by the CTS process (Step S5), and therefore the clock timing is also matched among the scan flip-flop cells 10 and the other cells after the replacement. There is no need for implementing CTS again in the design change procedure.

Let us consider a case that a typical buffer cell is used as a dummy cell, where the input capacitance of the input terminal of the buffer cell is assumed to be equal to the input capacitance of the clock terminal of a normal flip-flop cell. In such arrangement, the replacement of the buffer cell with a normal flip-flop cell is necessarily accompanied by the change in the position of the terminal to which the clock signal is inputted. Thus, the routing of the clock line connected to the flip-flop cell is required to be changed after the replacement. This process has influence on the clock skew and necessitates implementing CTS again.

It is apparent that the present invention is not limited to the above embodiments, but may be modified and changed without departing from the scope of the invention.

What is claimed is:

1. An integrated circuit comprising:
   a scan chain including a scan flip-flop and a dummy block,
   wherein said dummy block has a clock terminal receiving a clock signal, a scan input terminal connected to a scan data line within said scan chain, and a scan output terminal connected to another scan data line within said scan chain, and
   wherein said dummy block is configured to output data on said scan output terminal in response to input data fed to said scan input terminal, not responsively to said clock signal.

2. The integrated circuit according to claim 1, wherein said dummy block includes a through path connected between said scan input terminal and said scan output terminal.

3. The integrated circuit according to claim 2, wherein said through path comprises a combination circuit connected between said scan input terminal and said scan output terminal.

4. The integrated circuit according to claim 1, wherein said dummy block further includes a block terminal which is not connected to any interconnection outside said dummy block.

5. The integrated circuit according to claim 4, wherein said clock terminal and said block terminal are not connected to any interconnection within said dummy block.

6. The integrated circuit according to claim 1, wherein said scan flip-flop has a clock terminal receiving said clock signal, a scan input terminal, and a scan output terminal, and
   wherein a positional relation among said clock terminal, said scan input terminal, and said scan output terminal in said dummy block is same as a positional relation among said clock terminal, said scan input terminal, and said scan output terminal in said scan flip-flop.

7. The integrated circuit according to claim 1, wherein said scan flip-flop has a clock terminal receiving said clock signal, and
   wherein an input capacitance of said clock terminal is equal to that of said clock terminal of said dummy block.

8. The integrated circuit according to claim 1, wherein said dummy block has a same size as said scan flip-flop.

9. The integrated circuit according to claim 1, wherein said scan flip-flop and said dummy block includes transistors in a lower layer, and
   wherein a transistor structure of said dummy block is same as that of said scan flip-flop.

10. An integrated circuit design method comprising:
    placing cells including a scan flip-flop cell and a dummy block cell;
    implementing clock tree synthesis for said scan flip-flop cell and said dummy block cell; and
    implementing routing for said cells so that a scan chain including said scan flip-flop and said dummy block cell is formed,
    wherein said dummy block cell has a clock terminal receiving a clock signal, a scan input terminal connected to a scan data line within said scan chain, and a scan output terminal connected to another scan data line within said scan chain,
    wherein said dummy block cell is configured to output data on said scan output terminal in response to input data fed to said scan input terminal, not responsively to said clock signal.

11. The integrated circuit design method according to claim 10, wherein said dummy block cell additionally has a block terminal, and
    wherein said block terminal is not connected to any interconnections outside said dummy block cell in said routing.

12. The integrated circuit design method according to claim 11, wherein said clock terminal and said block terminal are not connected to any interconnection within said dummy block cell.

13. The integrated circuit design method according to claim 10, further comprising: replacing said dummy block cell with an additional scan flip-flop cell,
    wherein said dummy block cell has a same size as said additional scan flip-flop cell,
    wherein said additional scan flip-flop cell has a clock terminal receiving said clock signal, a scan input terminal and a scan output terminal, and
    wherein a positional relation among said clock terminal, said scan input terminal, and said scan output terminal in said dummy block cell is same as a positional relation among said clock terminal, said scan input terminal, and said scan output terminal in said additional scan flip-flop cell.

14. The integrated circuit design method according to claim 13, wherein an input capacitance of said clock terminal of said dummy block cell is equal to an input capacitance of said clock terminal of said additional scan flip-flop cell, and
    wherein clock tree synthesis is not implemented again after said replacing.

15. The integrated circuit design method according to claim 10, wherein said scan flip-flop and said dummy block includes transistors in a lower layer,
    wherein a transistor structure of said dummy block is same as that of said scan flip-flop, and
    wherein said integrated circuit design method further comprises rerouting interconnections in an upper layer positioned above said lower layer so that said dummy block cell operates identically to said scan flip-flop cell.

* * * * *